(12) United States Patent
Ju et al.

(10) Patent No.: US 12,482,785 B2
(45) Date of Patent: Nov. 25, 2025

(54) TRIM FREE WAFER BONDING METHODS AND DEVICES

(71) Applicant: Taiwan Semiconductor Manufacturing Co., Ltd., Hsinchu (TW)

(72) Inventors: Shi Ning Ju, Hsinchu (TW); Wen-Ting Lan, Hsinchu (TW); I-Han Huang, Hsinchu (TW); Kuo-Cheng Chiang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 827 days.

(21) Appl. No.: 17/750,239

(22) Filed: May 20, 2022

(65) Prior Publication Data

US 2023/0142902 A1 May 11, 2023

Related U.S. Application Data

(60) Provisional application No. 63/277,996, filed on Nov. 10, 2021.

(51) Int. Cl.
*H01L 23/00* (2006.01)

(52) U.S. Cl.
CPC .............. *H01L 24/80* (2013.01); *H01L 24/08* (2013.01); *H01L 24/98* (2013.01); *H01L 2224/08225* (2013.01); *H01L 2224/80006* (2013.01); *H01L 2224/80896* (2013.01); *H01L 2924/35121* (2013.01)

(58) Field of Classification Search
None
See application file for complete search history.

(56) References Cited

U.S. PATENT DOCUMENTS

| | | | |
|---|---|---|---|
| 9,041,214 B2 * | 5/2015 | Sadaka | H01L 25/50 257/774 |
| 2021/0082874 A1 * | 3/2021 | Chen | H01L 21/56 |
| 2022/0328447 A1 * | 10/2022 | Kao | H01L 23/5283 |

FOREIGN PATENT DOCUMENTS

TW I727523 B 5/2021

* cited by examiner

*Primary Examiner* — Michelle Mandala
(74) *Attorney, Agent, or Firm* — Seed IP Law Group

(57) ABSTRACT

A method of manufacturing a semiconductor device structure includes bonding a device substrate to a first de-bond layer. The first de-bond layer is disposed on a first carrier substrate, and the device substrate has a first side facing the first carrier substrate and a second side opposite from the first side. The device substrate has a first width. A front-end-of-line (FEOL) process and a back-end-of-line (BEOL) process are performed on the device substrate. A second carrier substrate having a second de-bond layer is bonded on the second side of the device substrate. The first carrier substrate is removed by removing the first de-bond layer. A width of the device substrate remains the first width after removing the first carrier substrate.

20 Claims, 12 Drawing Sheets

TRIM FREE WAFER BONDING METHODS AND DEVICES

PRIORITY CLAIM AND CROSS-REFERENCE

This application claims the benefit of U.S. Provisional Patent Application No. 63/277,996, filed Nov. 11, 2021, which is incorporated by reference herein in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, smaller and more creative packaging techniques of semiconductor dies are desired.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
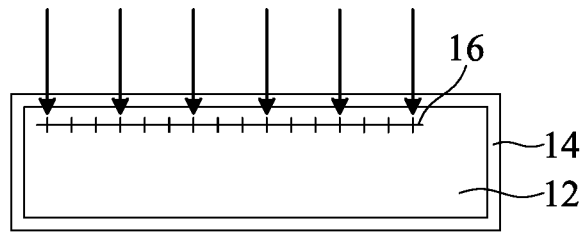
FIGS. 1A through 1I are cross-sectional diagrams schematically illustrating a semiconductor device manufacturing process, in accordance with one or more embodiments of the present disclosure.
Figure 1A:
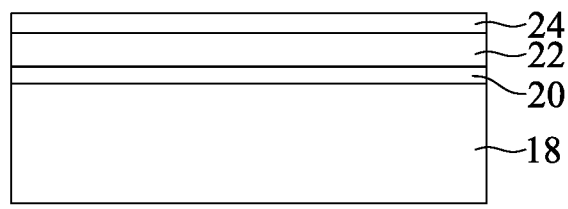

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, the present disclosure provides methods and devices in which de-bonding layers are formed between wafers and semiconductor device structures. The inclusion of the de-bonding layers facilitates removal of the wafers using a laser de-bonding process, which avoids or replaces trimming of the wafers as part of a process to thin down the wafer. By avoiding the trimming process, significant cost savings are accomplished through embodiments of the present disclosure, as the wafers are not trimmed and thus no portion of the wafers is wasted or lost as part of the semiconductor device manufacturing processes provided herein.

Moreover, the laser de-bonding processes implemented in various embodiments are relatively simple to perform in comparison to example processes in which trimming processes are utilized. Further, the manufacturing processes provided in various embodiments herein reduce manufacturing risks as the risk of breakage or damage is lowered since the wafers are not trimmed. Instead, the wafers maintain their original dimensions as they are not trimmed at all, and problems associated with trimmed edges can be avoided. Moreover, cost savings may be realized in accordance with methods provided herein, since the wafers can be reused as opposed to being wasted due to trimming processes. Additionally, embodiments provided herein facilitate formation of semiconductor devices having multiple semiconductor layers which may be formed in multiple bonding processes. For example, single bonding, double bonding, triple bonding, and any number of bonding processes may be utilized to manufacture semiconductor devices in accordance with some embodiments.

FIGS. 1A through 1I are cross-sectional diagrams schematically illustrating a semiconductor device manufacturing process, in accordance with one or more embodiments of the present disclosure. More particularly, FIGS. 1A through 1I illustrate a method of manufacturing semiconductor devices in which one or more trim-free de-bonding processes are performed during manufacture.

As shown in FIG. 1A, the method may include providing or receiving a device substrate or device wafer 12. The device wafer 12 may be formed of any material suitable for formation of semiconductor device features. In some embodiments, the device wafer 12 is a semiconductor wafer, which may be formed of any semiconductor material. In some embodiments, the device wafer 12 may be a monocrystalline silicon (Si) wafer, an amorphous Si wafer, a gallium arsenide (GaAs) wafer, or any other semiconductor wafer.

In some embodiments, an oxide layer 14 may be formed on the device wafer 12, and, in some embodiments, formation of the oxide layer 14 may be included as part of the process described herein. The oxide layer 14 may be referred to as a buried oxide layer, and is disposed on at least one surface of the device wafer 12. In some embodiments, the oxide layer 14 may surround the device wafer 12 and may be disposed on a top surface, bottom surface, and side surfaces of the device wafer 12. The oxide layer 14 may be formed of any suitable oxide, and in some embodiments, may be a silicon dioxide ($SiO_2$) layer. The device wafer 12 and oxide layer 14 may be collectively referred to as a silicon-on-insulator (SOI) wafer, in some embodiments. The oxide layer 14 may be formed by any suitable process, including, for example, by deposition, thermal oxidation, or any other suitable technique.

In some embodiments, the device wafer 12 may include implanted ions 16. The ions 16 may be implanted at a substantially same depth, for example, along at least a portion of a length of the device wafer 12. In some embodiments, the implanted ions 16 may have an implant profile, such that the implanted ions 16 are distributed at various different depths of the device wafer 12; however, it should be readily appreciated that the implanted ions 16 have a peak concentration or density along a line, as shown in FIG. 1A. For example, the implant profile may be a normal distribution curve or substantially normal distribution curve, and the peak concentration or density of the implanted ions 16 may be a line or curve where the device wafer 12 will be split during subsequent processing (see FIG. 1C). Accordingly, the description herein regarding a "depth" of the implanted ions 16 may refer to a depth of a line at which a peak concentration or density of ions are implanted, and which forms a zone for splitting the device wafer 12 as described herein.

In some embodiments, the ions 16 may be implanted at a depth within a range from 100 nm to 200 nm, although embodiments herein are limited thereto and various different ion implantation depths may be utilized in various embodiments. As will be discussed in further detail later herein, the depth of the implanted ions 16 may at least partially determine a thickness of a portion of the device wafer 12 that is utilized in later stages of the manufacturing method described herein. As such, the depth of the implanted ions 16 may be selected as desired according to design considerations, including a desired thickness of the semiconductor material of the device wafer 12 to be utilized in later stage processing.

In some embodiments, the implanted ions 16 are hydrogen (H+) ions, although other ion species may be utilized in accordance with one or more embodiments. Implantation of the ions 16 may be included as part of the method described herein, in accordance with some embodiments.

Further, as shown in FIG. 1A, the method may include providing or receiving a first carrier substrate or first carrier wafer 18. It will be readily appreciated that the device wafers and carrier wafers described herein may be interchangeably termed "substrates." The first carrier wafer 18 may be any wafer or substrate suitable for bonding to the device wafer 12 or oxide layer 14, for example, to support the device wafer 12 during subsequent processing. In some embodiments, the first carrier wafer 18 may be a semiconductor wafer, such as a monocrystalline silicon (Si) wafer, an amorphous Si wafer, a gallium arsenide (GaAs) wafer, or any other semiconductor wafer. In some embodiments, the first carrier wafer 18 may be a glass wafer or any other substrate material suitable for carrying the device wafer 12 during processing.

In some embodiments, the first carrier wafer 18 may have a thickness within a range from 500 µm to 1000 µm. In some embodiments, the first carrier wafer 18 may have a thickness of about or equal to 775 µm.

In some embodiments, a first dielectric layer 20 is formed on a surface of the first carrier wafer 18. A de-bonding layer 22 may be formed on the first dielectric layer 20, and a second dielectric layer 24 may be formed on the de-bonding layer 22. The first and second dielectric layers 20, 24 may be formed of any suitable dielectric materials, and in some embodiments, may be oxide or nitride layers. In some embodiments, each of the first and second dielectric layers 20, 24 is an oxide layer, such as a $SiO_2$ layer.

The de-bonding layer 22 may be formed of any material suitable for bonding the device wafer 12 to the first carrier wafer 18, or for bonding the first and second dielectric layers 20, 24 to one another. Moreover, the de-bonding layer 22 may be formed of any material suitable to be readily removed, thereby releasing the first carrier wafer 18 from the device wafer 12 upon removal of the de-bonding layer 22. In some embodiments, the de-bonding layer 22 may include one or more of SiCN, SiOCN, SiN, $SiO_2$, $HfO_2$, $ZrO_2$, $HfAlO_x$, $HfSiO_x$, TiN, an organic material, or any other suitable de-bonding layer material. In some embodiments, the de-bonding layer 22 may be an adhesive layer.

The de-bonding layer 22 may be formed by any suitable technique, including, in some embodiments, by deposition, thermal oxidation, spin coating, or any other semiconductor process capable of forming a de-bonding layer. In some embodiments, the de-bonding layer 22 is formed of an inorganic material, which may be formed by a deposition process, such as by chemical vapor deposition or any other suitable deposition technique.

The de-bonding layer 22 and the first and second dielectric layers 20, 24 may be collectively referred to herein as a "de-bonding layer" or a "de-bonding structure," and the de-bonding layer 22 may be referred to herein as a de-bonding material layer.

Figure 1B:
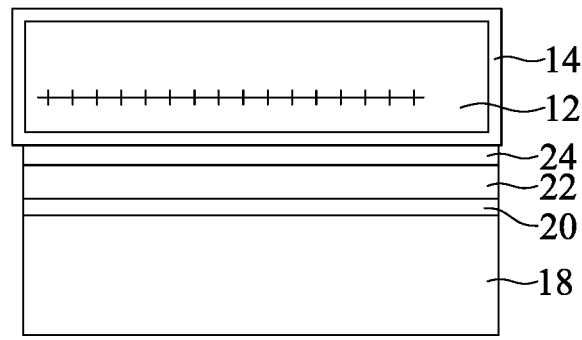

As shown in FIG. 1B, the device wafer 12 is bonded to the first carrier wafer 18. More particularly, in some embodiments, the oxide layer 14 on the device wafer 12 may be bonded directly to the second dielectric layer 24 on the first carrier wafer 18, thereby securing the device wafer 12 to the structures on the first carrier wafer 18. The device wafer 12 may be oriented such that the surface through which the ions 16 were implanted (e.g., the top surface as shown in FIG. 1A) is flipped over and faces the first carrier wafer 18 during the bonding.

Bonding of the device wafer 12 to the first carrier wafer 18 may be performed by any suitable bonding technique. In some embodiments, the device wafer 12 may be bonded to the first carrier wafer 18 in a bonding chamber in which each of the device wafer 12 and first carrier wafer 18 may be held by respective wafer chucks and may be brought into contact with one another and pressed or forced against one another to complete the bonding. In some embodiments, vacuum or mechanical pressures may be applied to facilitate the bonding of the device wafer 12 and first carrier wafer 18.

Figure 1C:
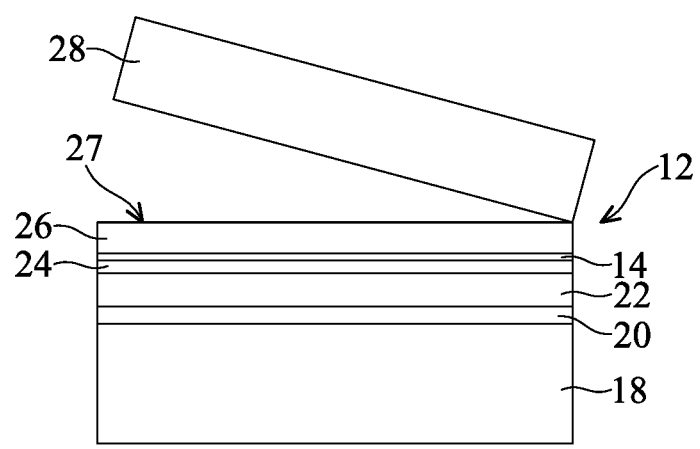

As shown in FIG. 1C, the method may include forming a semiconductor device layer 26 by splitting the device wafer 12. The device wafer 12 may be split by any suitable technique, and in some embodiments, the device wafer 12 is split along a length of the device wafer 12 in which the ions 16 were implanted, for example, by an ion-cut technique. In some embodiments, the device wafer 12 is split by thermal annealing, which induces splitting of the device wafer 12 along the line or depth at which the ions 16 are present, thereby causing or facilitating removal of a remaining portion 28 of the device wafer 12. The thermal annealing may be performed at any conditions suitable to form the semiconductor device layer 26 by causing splitting or fracture of the device wafer 12. In some embodiments, the thermal annealing process is performed at a temperature within a range from 600° C. to 1100° C.

The semiconductor device layer 26 may have a thickness that is substantially equal or equal to the depth of the implanted ions 26. For example, in some embodiments, the semiconductor device layer 26 may have a thickness within a range from 100 nm to 200 nm, although embodiments herein are limited thereto and the semiconductor device layer 26 may have various different thicknesses in various embodiments. As discussed previously herein, the depth of the implanted ions 16 may refer to a depth of a line at which a peak concentration or density of ions are implanted, and which forms a zone for splitting the device wafer 12.

The remaining portion 28 of the device wafer 12 may be utilized in other processes, including, for example, as a carrier wafer or device wafer for formation of subsequent semiconductor devices.

As shown in FIG. 1C, a portion of the oxide layer 14 may remain between the semiconductor device layer 26 and the second dielectric layer 24. In some embodiments, the oxide layer 14 may be removed from side surfaces of the semiconductor device layer 26. In other embodiments, the oxide layer 14 may remain present on side surfaces of the semiconductor device layer 26.

The method may further include processing an exposed surface 27 of the semiconductor device layer 26. For example, the exposed surface 27 of the semiconductor device layer 26 may be polished to reduce roughness, thereby providing a high quality and smooth surface for formation of semiconductor device features in the semiconductor device layer 26. In some embodiments, the exposed surface 27 of the semiconductor device layer 26 may have a roughness of less than 5 Å, for example, after the surface 27 is polished. In some embodiments, the exposed surface 27 may have a roughness of less than 2 Å, and in some embodiments, the exposed surface 27 may have a roughness of about 1.5 Å. In some embodiments, a total thickness variation (TTV) of the semiconductor device layer 26 may be less than 100 Å, and in some embodiments, the total thickness variation of the semiconductor device layer 26 may be less than 50 Å.

Figure 1D:
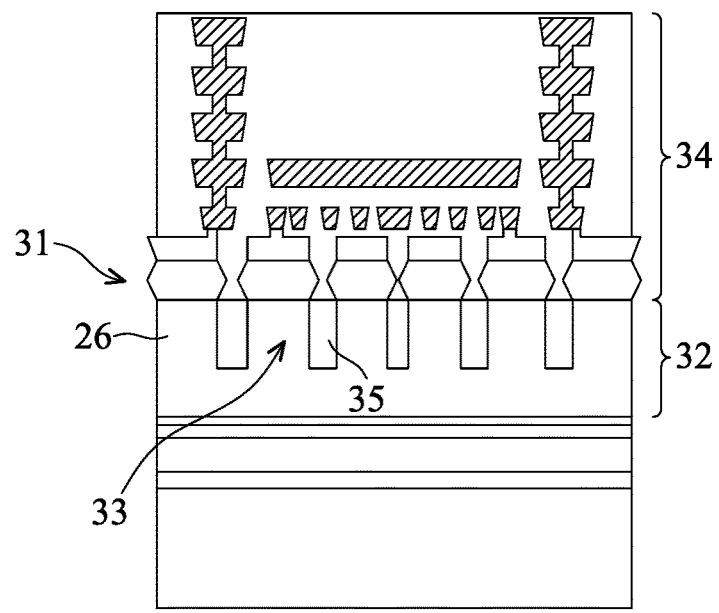

As shown in FIG. 1D, the method may include performing at least one front-end-of-line (FEOL) process and at least one back-end-of-line (BEOL) process. For example, the method may include forming one or more FEOL structures 32 in the semiconductor device layer 26 and forming one or more BEOL structures 34 on the FEOL structures 32. The FEOL structures 32 and BEOL structures 34 may be collectively referred to herein as the "semiconductor device structure" 31.

The FEOL structures 32 may include any semiconductor device structures. For example, in some embodiments, the FEOL structures 32 include one or more transistors, capacitors, resistors, or any other semiconductor device structures or features which may be patterned or otherwise formed in the semiconductor device layer 26. In some embodiments, the FEOL structures 32 may include a plurality of transistors 33 separated from one another by shallow trench isolation (STI) structures 35. The FEOL structures 32 may be formed by any suitable FEOL processes, including FEOL processes for forming semiconductor device structures.

The BEOL structures 34 may include any interconnection structures, such as conductive lines or wiring structures that may be electrically coupled or connected to one or more of the FEOL structures 32, such as the transistors 33. In some embodiments, the BEOL structures 34 may include one or more metallization layers, dielectric or insulating layers, metal levels, contacts, bonding sites, or the like. The BEOL structures 34 may be formed by any suitable BEOL processes, including conventional BEOL processes for forming BEOL structures.

Figure 1E:
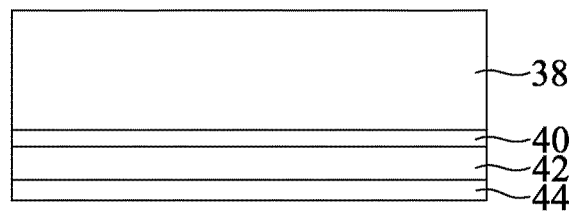
Figure 1E:
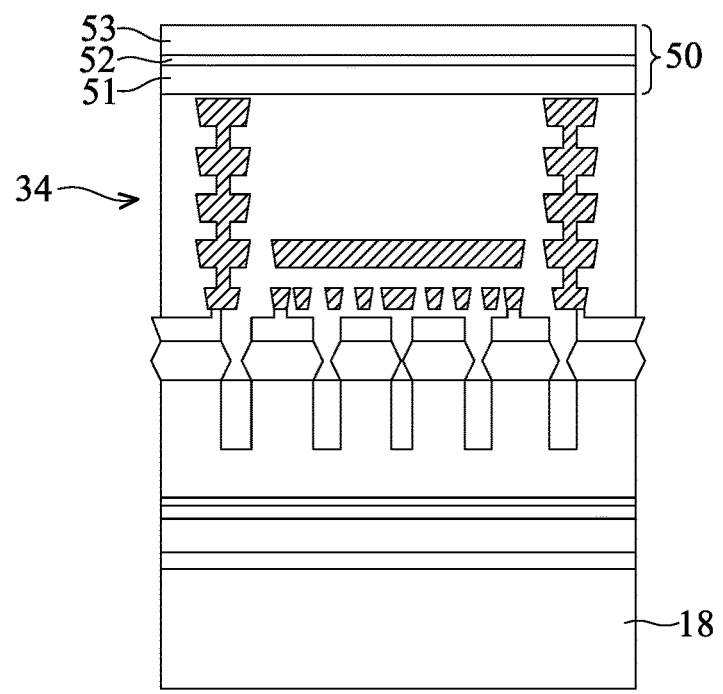

As shown in FIG. 1E, the method may include forming a dielectric structure 50 on the BEOL structures 34, which may be, for example, an interconnection layer. The dielectric structure 50 may include one or more dielectric layers, which may be formed of any suitable dielectric materials. In some embodiments, the dielectric structure 50 includes a first dielectric layer 51, a second dielectric layer 52 on the first dielectric layer 51, and a third dielectric layer 53 on the second dielectric layer 52. In some embodiments, the first dielectric layer 51 is an oxide layer, which may be any suitable oxide, including, for example, silicon dioxide ($SiO_2$). In some embodiments, the second dielectric layer is a nitride layer, such as a silicon nitride layer. In some embodiments, the third dielectric layer 53 is an oxide layer, such as silicon dioxide ($SiO_2$).

Further, as shown in FIG. 1E, the method may include providing or receiving a second carrier wafer 38. The second carrier wafer 38 may be any wafer or substrate suitable for bonding to the semiconductor device structure attached to or otherwise carried by the first carrier wafer 18, for example, suitable for bonding to the dielectric structure 50 formed on the BEOL structures 34. In some embodiments, the second carrier wafer 38 may be a semiconductor wafer, such as a monocrystalline silicon (Si) wafer, an amorphous Si wafer, a gallium arsenide (GaAs) wafer, or any other semiconductor wafer. In some embodiments, the second carrier wafer 38 may be a glass wafer or any other substrate material suitable for carrying the semiconductor device structures during processing.

In some embodiments, the second carrier wafer 38 may have a thickness within a range from 500 µm to 1000 µm. In some embodiments, the second carrier wafer 38 may have a thickness of about or equal to 775 µm.

In some embodiments, a first dielectric layer 40 is formed on a surface of the second carrier wafer 38. A de-bonding layer 42 may be formed on the first dielectric layer 40, and a second dielectric layer 44 may be formed on the de-bonding layer 42. The first and second dielectric layers 40, 44 may be formed of any suitable dielectric materials, and in some embodiments, may be oxide or nitride layers. In some embodiments, each of the first and second dielectric layers 40, 44 is an oxide layer, such as a $SiO_2$ layer.

The de-bonding layer 42 may be formed of any material suitable for bonding the BEOL structures 34 to the second carrier wafer 38, or for bonding the first and second dielectric layers 40, 44 to one another. Moreover, the de-bonding layer 42 may be formed of any material suitable to be readily removed, thereby releasing the second carrier wafer 38 from the semiconductor device structures (e.g., the BEOL structures 34) upon removal of the de-bonding layer 42. In some embodiments, the de-bonding layer 42 may include one or more of SiCN, SiOCN, SiN, SiO2, SiO$_2$, HfO$_2$, ZrO$_2$, HfAlO$_x$, HfSiO$_x$, TiN, an organic material, or any other suitable de-bonding layer material. In some embodiments, the de-bonding layer 42 may be an adhesive layer.

Figure 1F:
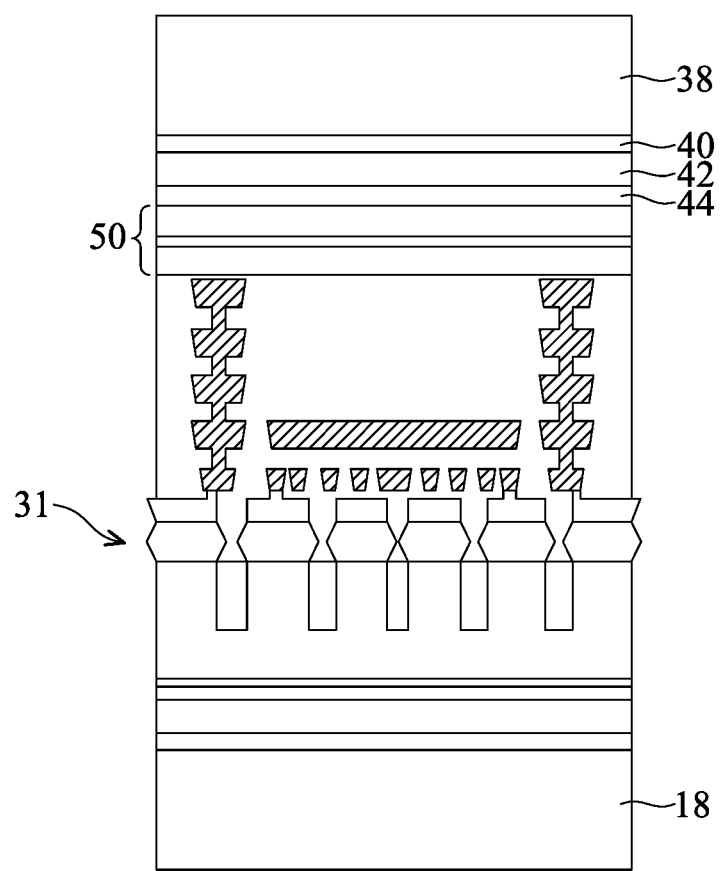

As shown in FIG. 1F, the semiconductor device structure carried by the first carrier wafer 18 is bonded to the second carrier wafer 38. More particularly, in some embodiments, the third dielectric layer 53 on the BEOL structures 34 may be bonded directly to the second dielectric layer 44 on the second carrier wafer 38, thereby securing the second carrier wafer 38 to the semiconductor device structures carried on the first carrier wafer 18.

Bonding of the second carrier wafer 38 to the semiconductor device structures on the first carrier wafer 18 may be performed by any suitable bonding technique, including for example, by applying pressure or a pressing force to complete the bonding in a bonding chamber.

Figure 1G:
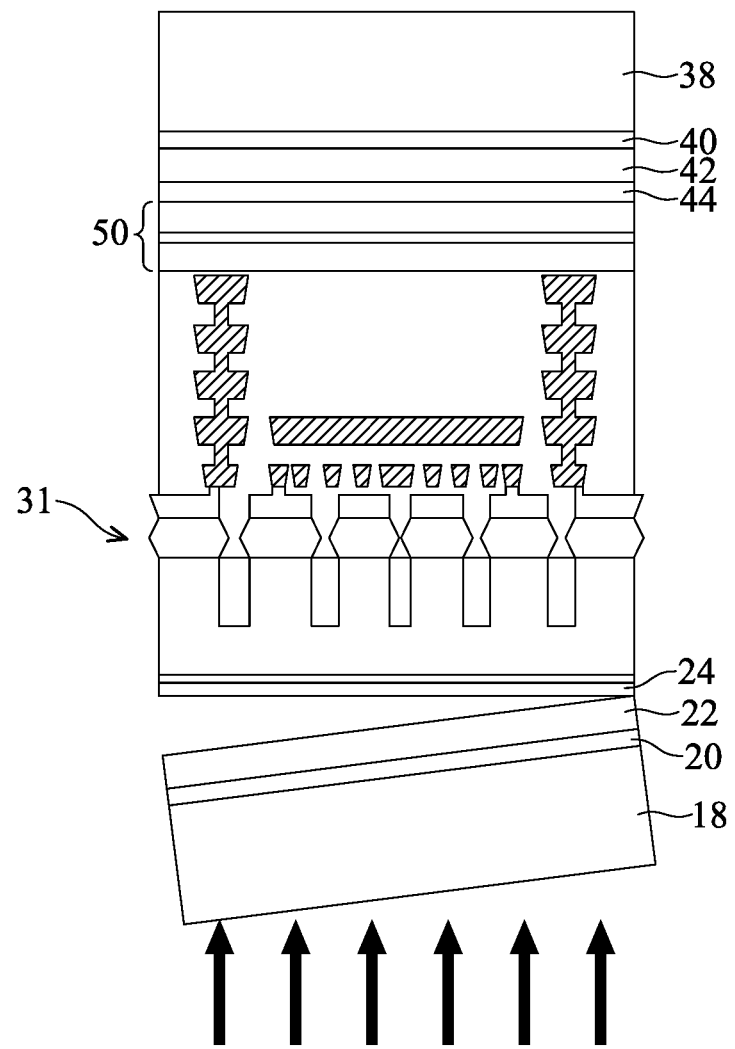

As shown in FIG. 1G, the first carrier wafer 18 is removed from the semiconductor device structure 31. The first carrier wafer 18 may be removed from the semiconductor device structure 31 by a de-bonding process in which the de-bonding layer 22 is separated from the semiconductor device structure 31.

The de-bonding layer 22 may be removed by any suitable process. In some embodiments, the de-bonding layer 22 is removed from the semiconductor device structure 31 by a laser or ultraviolet (UV) light de-bonding process. For example, in some embodiments, the de-bonding layer 22 may be formed of a light-sensitive de-bonding or adhesive material, and the first carrier wafer 18 may be removed by exposing the de-bonding layer 22 to irradiation from an irradiation source, causing it to lose its adhesive or bonding property. The irradiation source may be any suitable irradiation source, and in some embodiments, may be a laser, a UV laser, an infrared (IR) laser, or the like. In some embodiments, the first carrier wafer 18 is transparent or at least partially transparent to the laser radiation. For example, the first carrier wafer 18 may be a glass wafer which allows the laser irradiation to pass through the first carrier wafer 18 and irradiate the de-bonding layer 22.

In some embodiments, the de-bonding layer 22 is formed of a material selected to absorb the wavelength of laser irradiation that may be used to remove the de-bonding layer 22. During removal, the material of the de-bonding layer 22 may absorb the laser irradiation, which may cause or otherwise facilitate breaking of bonds within the de-bonding layer 22 or between the de-bonding layer 22 and one or more structures or layers in contact, such as the second dielectric layer 24.

In some embodiments, the de-bonding layer 22 may be an adhesive layer that is de-bonded utilizing a laser having a wavelength suitable to be absorbed by the adhesive layer and to cause de-bonding of the structures as shown in FIG. 1G. In some embodiments, the second dielectric layer 24 remains attached to the semiconductor device structure 31 after the de-bonding process is performed. In some embodiments, the second dielectric layer 24 may be utilized to protect the semiconductor device structure 31 during the de-bonding process, for example, by absorbing at least some of the laser irradiation, thereby preventing or reducing damage which may otherwise be caused by laser irradiation being incident upon the semiconductor device structures.

In some embodiments, grinding, etching, chemical-mechanical-polishing (CMP) or other similar processes may be performed to remove any excess portions of the de-bonding layer 22 or to remove the second dielectric layer 24 from the backside of the semiconductor device structure 31.

In some embodiments, the first carrier wafer 18 may be reused in a subsequent process, for example, for manufacturing a subsequent semiconductor device structure. Since the first carrier wafer 18 is not trimmed by any trimming process during manufacturing of the semiconductor device structure 31, the first carrier wafer 18 maintains its original dimensions and therefore may be used in subsequent processes.

Figure 1H:
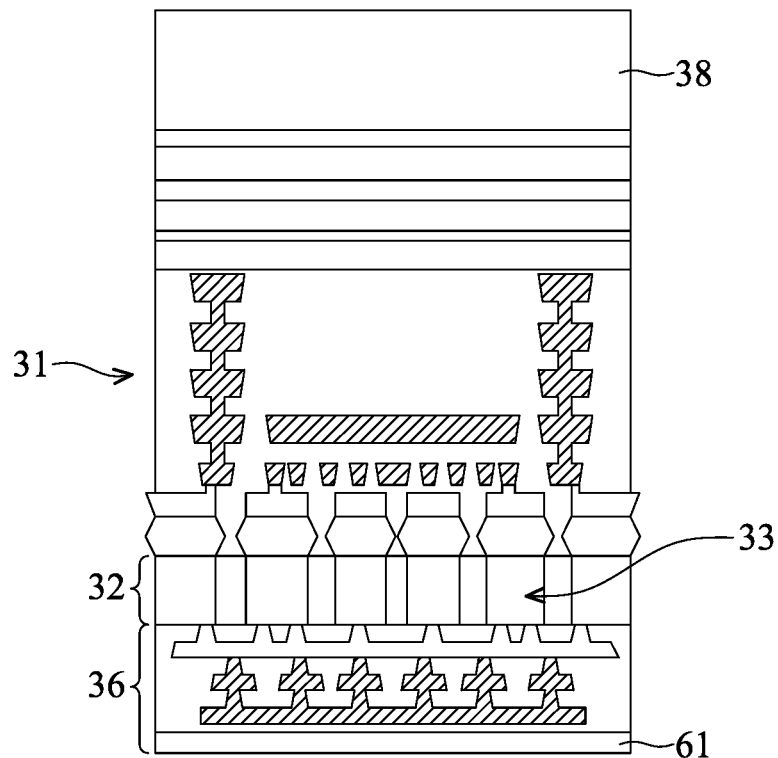
Figure 1H:
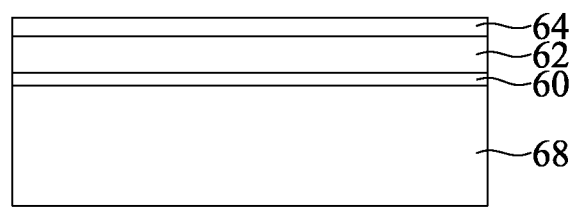

As shown in FIG. 1H, the method may include performing at least one backside process. For example, the method may include forming one or more backside structures 36 on the backside of the semiconductor device structure 31. In some embodiments, the backside structures 36 may include any backside interconnection structures, such as backside conductive lines or wiring structures that may be electrically coupled or connected to one or more of the FEOL structures 32, such as the transistors 33. In some embodiments, the backside structures 36 may include one or more backside metallization layers, dielectric or insulating layers, metal levels, contacts, bonding sites, power rails, or the like. The backside structures 36 may be formed by any suitable backside processes, including conventional backside processes, such as backside metallization processes for forming backside structures.

In some embodiments, one or more portions of the semiconductor device layer 26 may be at least partially removed during the backside processing.

A dielectric layer 61 may be formed on the backside of the semiconductor device structure 31, for example, on the backside of the backside structures 36. In some embodiments, the dielectric layer 61 may be an oxide layer, such as a SiO$_2$ layer.

Further, as shown in FIG. 1H, the method may include providing or receiving a third carrier wafer 68. The third carrier wafer 68 may be any wafer or substrate suitable for bonding to the semiconductor device structure 31 attached to or otherwise carried by the second carrier wafer 38, for example, suitable for bonding to the dielectric layer 61 formed on the backside of the backside structures 36. In some embodiments, the third carrier wafer 68 may be a semiconductor wafer, such as a monocrystalline silicon (Si) wafer, an amorphous Si wafer, a gallium arsenide (GaAs) wafer, or any other semiconductor wafer. In some embodiments, the third carrier wafer 68 may be a glass wafer or any other substrate material suitable for carrying the semiconductor device structures during processing.

In some embodiments, the third carrier wafer 68 may have a thickness within a range from 500 µm to 1000 µm. In some embodiments, the third carrier wafer 68 may have a thickness of about or equal to 775 µm.

In some embodiments, a first dielectric layer 60 is formed on a surface of the third carrier wafer 68. A de-bonding layer 62 may be formed on the first dielectric layer 60, and a second dielectric layer 64 may be formed on the de-bonding layer 62. The first and second dielectric layers 60, 64 may be formed of any suitable dielectric materials, and in some embodiments, may be oxide or nitride layers. In some embodiments, each of the first and second dielectric layers 60, 64 is an oxide layer, such as a SiO$_2$ layer.

The de-bonding layer 62 may be formed of any material suitable for bonding the semiconductor device structure 31 to the third carrier wafer 68, or for bonding the first and second dielectric layers 60, 64 to one another. The de-bonding layer 62 may be formed of any material suitable to be readily removed, thereby releasing the third carrier wafer 68 from the semiconductor device structure 31 upon removal of the de-bonding layer 62. In some embodiments, the de-bonding layer 62 may include one or more of SiCN, SiOCN, SiN, SiO$_2$, HfO$_2$, ZrO$_2$, HfAlO$_x$, HfSiO$_x$, TiN, an organic material, or any other suitable de-bonding layer material. In some embodiments, the de-bonding layer 62 may be an adhesive layer.

Figure 1I:
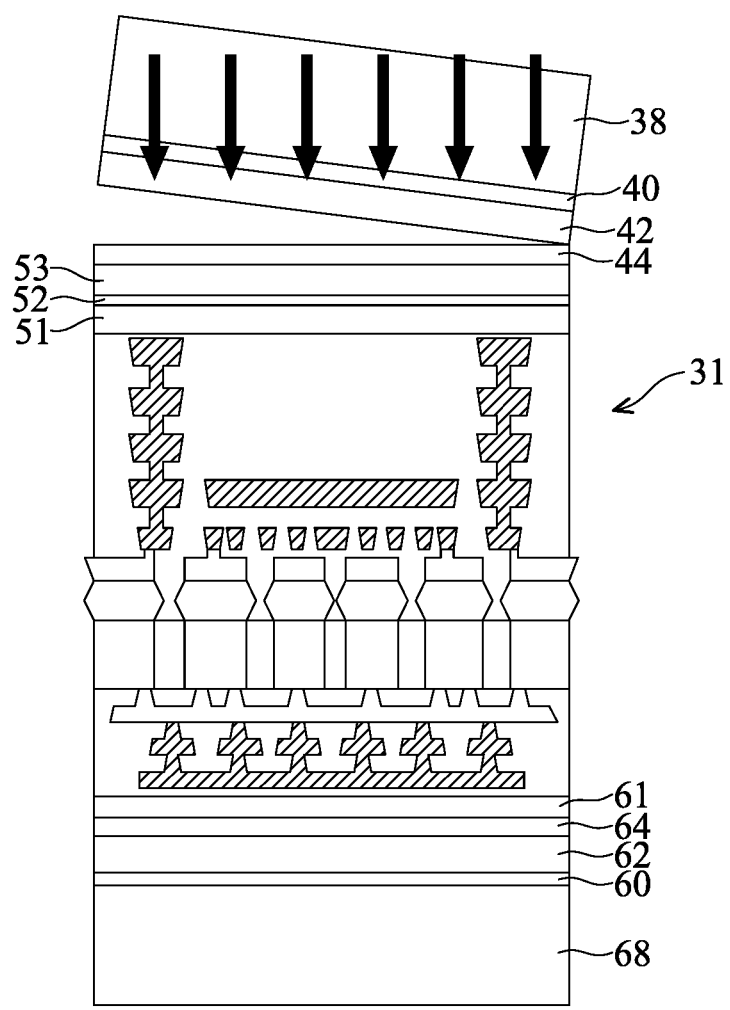

As shown in FIG. 1I, the semiconductor device structure 31 carried by the second carrier wafer 38 is bonded to the third carrier wafer 68. More particularly, in some embodiments, the dielectric layer 61 on the backside of the semiconductor device structure 31 may be bonded directly to the second dielectric layer 64 on the third carrier wafer 68, thereby securing the third carrier wafer 68 to the semiconductor device structure 31 carried on the second carrier wafer 38.

Bonding of the third carrier wafer 68 to the semiconductor device structure 31 on the second carrier wafer 38 may be performed by any suitable bonding technique, including for example, by applying pressure or a pressing force to complete the bonding in a bonding chamber.

Further, as shown in FIG. 1I, the second carrier wafer 38 is removed from the semiconductor device structure 31. The second carrier wafer 38 may be removed from the semiconductor device structure 31 by a de-bonding process in which the de-bonding layer 42 is separated from the semiconductor device structure 31.

The de-bonding layer 42 may be removed by any suitable process. In some embodiments, the de-bonding layer 42 is removed from the semiconductor device structure 31 by a laser or ultraviolet (UV) light de-bonding process, for example, as previously described herein. For example, in some embodiments, the de-bonding layer 42 may be formed of a light-sensitive de-bonding or adhesive material, and the second carrier wafer 38 may be removed by exposing the de-bonding layer 42 to irradiation from an irradiation source such as a laser, causing it to lose its adhesive or bonding property.

In some embodiments, the second dielectric layer 44 remains attached to the semiconductor device structure 31 after the de-bonding process is performed. In some embodiments, the second dielectric layer 44 may be utilized to protect the semiconductor device structure 31 during the de-bonding process, for example, by absorbing at least some of the laser irradiation, thereby preventing or reducing damage which may otherwise be caused by laser irradiation being incident upon the semiconductor device structures.

In some embodiments, grinding, etching, chemical-mechanical-polishing (CMP) or other similar processes may be performed to remove excess portions of the de-bonding layer 42 or to remove the second dielectric layer 44, or any of the dielectric layers 51, 52, 53 from the front side of the semiconductor device structure 31.

In some embodiments, the second carrier wafer 38 may be reused in a subsequent process, for example, for manufacturing a subsequent semiconductor device structure. Since the second carrier wafer 38 is not trimmed by any trimming process during manufacturing of the semiconductor device structure 31, the second carrier wafer 38 maintains its original dimensions and therefore may be used in subsequent processes.

Following the processes shown and described with respect to FIG. 1I, the method may continue to further front side and backside processing as may be desired depending on design considerations, such as particular semiconductor or conductive features to be included as part of the final semiconductor device. For example, in various embodiments, the second dielectric layer 44, and the dielectric layers 51, 52, 53 may be removed from the front side of the semiconductor device structure 31, and additional features may be formed on the semiconductor device structure 31. For example, one or more conductive pads, leads, solder balls, solder bumps, or the like may be formed on the front side of the semiconductor device structure 31 in subsequence processes.

In some embodiments, the method may include removing the third carrier wafer 68. The third carrier wafer 68 may be removed by a de-bonding process as previously described herein. For example, in some embodiments, the third carrier wafer 68 may be removed by removing the de-bonding layer 62 through a laser de-bonding process. Moreover, in some embodiments, a backside CMP process may be performed to expose the backside of the semiconductor device structure 31 (e.g., the backside of the backside structures 36) by removing excess portions of the de-bonding layer 62, the dielectric layer 61, or the second dielectric layer 64.

Moreover, it should be readily appreciated one or more of the processing steps illustrated in FIGS. 1A through 1I may be repeated iteratively in various embodiments. For example, in some embodiments, after additional front side processing is performed following the removal of the second carrier wafer 38 as illustrated in FIG. 1I, a fourth carrier wafer may be bonded to the front side of the resulting semiconductor device structure, and the third carrier wafer may be removed by the de-bonding process. This would result in an exposed backside of the semiconductor device structure 31 which may be further processed, for example, by forming additional features on the exposed backside of the semiconductor device structure 31. In such embodiments, the fourth or any last or final carrier wafer may be removed prior to completing processing of the semiconductor device structure 31, and may be removed by any de-bonding processes as described herein or by any other process, such as by cutting, chemical mechanical polishing, or any other suitable technique.

Figure 2A:
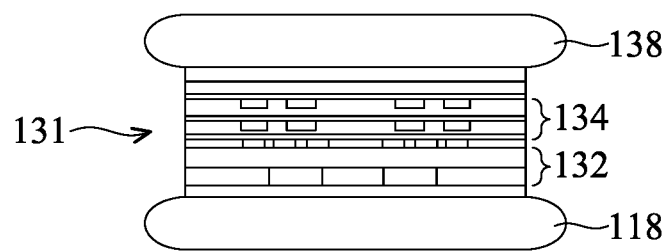
FIGS. 2A through 2C illustrate a method of manufacturing a semiconductor device in accordance with a comparative example in which trimming is performed to avoid edge cracking and peeling during wafer thin down processes.
Figure 2B:
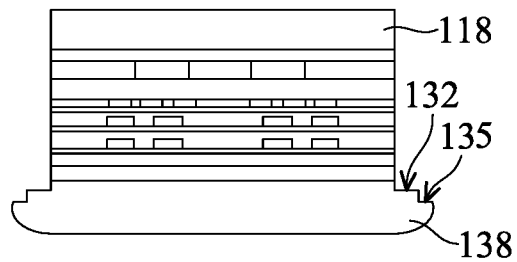
Figure 2C:
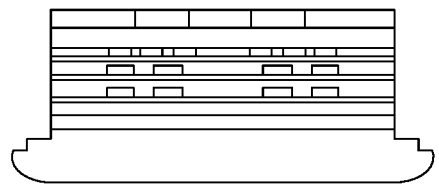

FIGS. 2A through 2C illustrate a method of manufacturing a semiconductor device in accordance with a comparative example in which trimming is performed to avoid edge cracking and peeling during wafer thin down processes.

As shown in FIG. 2A, the comparative example includes bonding a first wafer 118 and a second wafer 138 to a semiconductor device structure 131. The semiconductor device structure 131 is illustrated as already having FEOL structures 132 and BEOL structures 134; however, it should be readily appreciated that the trim down process of the comparative example may be performed at various stages of manufacturing of the device, including prior to formation of the FEOL structures 132 or the BEOL structures 134.

In the comparative example illustrated in FIGS. 2A through 2C, a bevel seal material, such as an epoxy, may be applied at the lateral edges of the semiconductor device structure 131 to fill any non-bond areas between the device wafer (e.g., the first wafer 118) and the semiconductor device structure 131.

As shown in FIG. 2B, the structure is flipped over and a trimming process is performed, in which portions of the first wafer 118 are removed by trimming the first wafer 118, which may be the device wafer in or on which semiconductor device features are formed. The first wafer 118 is trimmed in order to avoid formation of sharp edges which would otherwise result at the rounded or otherwise non-vertical edges of the first wafer 118 when the first wafer 118 is thinned down, for example, by a grinding process. Sharp edges can result in cracks at the edges of the first wafer 118 which can further result in peeling between the first wafer 118 and the semiconductor device structure 131, and thus should generally be avoided. Moreover, the thinning down of the first wafer 118 can cause edge roll-off which may induce formation of non-bonding regions between the first wafer 118 and the semiconductor device structure 131. As such, the trimming process is performed to avoid formation of the sharp edges and thereby avoid formation of cracks and peelings at the wafer edges, as well as to remove lateral portions of the first wafer 118 or the semiconductor device structure 131 at the non-bond regions.

The trimming process shown in FIG. 2B further may remove or trim lateral edge portions of the semiconductor device 131 and of the second wafer 138 (which may be a carrier wafer). The trimming process generally includes two separate trimming procedures in order to cover the non-bond areas and fully remove any bevel seal material or epoxy at the lateral edges of the structure. A first trimming procedure trims the lateral edge portions of the first wafer 118 and forms a first trimmed surface 132 on the second wafer 138. A second trimming procedure forms a second trimmed surface 135 on the second wafer 138.

As shown in FIG. 2C, a thin down process is performed which removes portions of the device wafer (e.g., the first wafer 118). The thin down process may be performed by grinding the first wafer 118 from the backside. In some embodiments, the thin down process may include a dry etch or other etching process to remove or thin down the first wafer 118.

The processes of the comparative example are generally more complex and require higher cost than the method illustrated with respect to FIGS. 1A through 1I in accordance with embodiments of the present disclosure, since portions of the carrier wafer or the device wafer are consumed during the trimming processes of the comparative example. Moreover, the stepped structure will be revealed at the edge of the carrier wafer of the comparative example when being trimmed, which causes risk for follow-up processes. For processes which may utilize multiple or many wafer bonding processes (e.g., formation of 3-dimensional integrated circuit (3D-IC) devices utilizing multiple carrier wafers), the processes of the comparative example result in trimming and therefore loss of each of the plurality of carrier wafers.

In contrast, in accordance with methods provided in various embodiments herein, the trimming processes can be avoided during formation of semiconductor devices, including 3D-IC devices which may involve multiple bonding steps. In particular, the bonding of carrier wafers utilizing a de-bonding structure including a de-bonding layer, and in some embodiments one or more dielectric layers, facilitates removal of the carrier wafers by a laser de-bonding process. This not only avoids trimming of the wafers, but further allows more devices or semiconductor dies to be formed on a same carrier wafer, as the devices or semiconductor dies at the wafer edges are not trimmed and thus maintain their integrity and can be used.

FIGS. 3A through 3E are cross-sectional diagrams schematically illustrating a semiconductor device manufacturing process, in accordance with one or more embodiments of the present disclosure. More particularly, FIGS. 3A through 3E illustrate a "single bonding" method of manufacturing semiconductor devices.

Figure 3A:
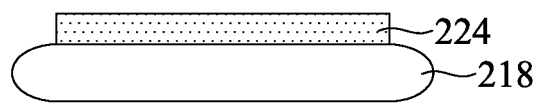
FIGS. 3A through 3E are cross-sectional diagrams schematically illustrating a semiconductor device manufacturing process, in accordance with one or more embodiments of the present disclosure.

As shown in FIG. 3A, the method may include forming a de-bonding structure 224 on a first carrier wafer 218. The first carrier wafer 218 may be the same or substantially the same as the first carrier wafer 18 described previously herein. Similarly, the de-bonding structure 224 may be the same or substantially the same as the de-bonding structure described previously herein with respect to FIG. 1A, for example, the de-bonding structure 224 may include a de-bonding layer 22 disposed between first and second dielectric layers 20, 24.

Figure 3B:
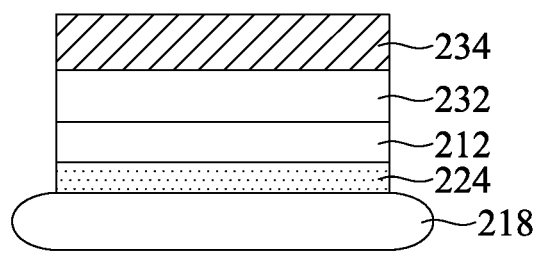

As shown in FIG. 3B, a device wafer 212 is bonded to the de-bonding structure 224 on the first carrier wafer 218. The device wafer 212 may be bonded to the first carrier wafer 218 by any suitable technique, such as by bonding processes previously described herein. Moreover, the device wafer 212 may be split or reduced in thickness as previously described herein, for example, with respect to FIG. 1C.

FEOL structures 232 and BEOL structures 234 are formed on the device wafer 212. The formation of the FEOL structures 232 and BEOL structures 234 may be the same or substantially the same as that of the FEOL structures 32 and BEOL structures 34 described previously herein, for example, with respect to FIG. 1D.

Figure 3C:
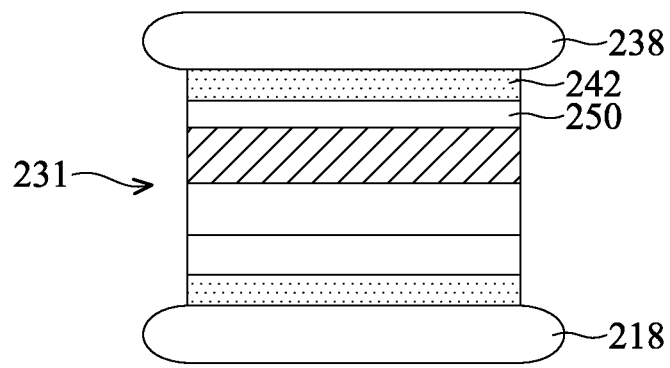

As shown in FIG. 3C, a dielectric structure 250 is formed on the BEOL structures 234. The dielectric structure 250 may be the same or substantially the same as the dielectric structure 50 described previously herein with respect to FIG. 1E. A second carrier wafer 238 is bonded to the semiconductor device structure 231. More particularly, a de-bonding structure 242 is formed on the second carrier wafer 238, and the de-bonding structure 242 may be the same or substantially the same as the de-bonding structure described previously herein with respect to FIG. 1E, for example, the de-bonding structure 242 may include a de-bonding layer 42 disposed between first and second dielectric layers 40, 44. The de-bonding structure 242 may be bonded to the dielectric structure 250.

Figure 3D:
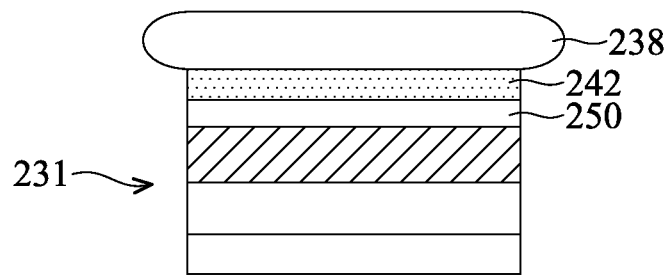

As shown in FIG. 3D, the first carrier wafer 218 is removed by a de-bonding process, which may be the same or substantially the same as previously described herein. For example, the first carrier wafer 218 may be removed by a laser de-bonding process in which the de-bonding layer of the de-bonding structure 224 is irradiated with laser radiation, thereby loosening or weakening the bond or adhesion to the device wafer 212 and causing the first carrier wafer 218 and the de-bonding structure 224 to separate and easily be removed.

Figure 3E:
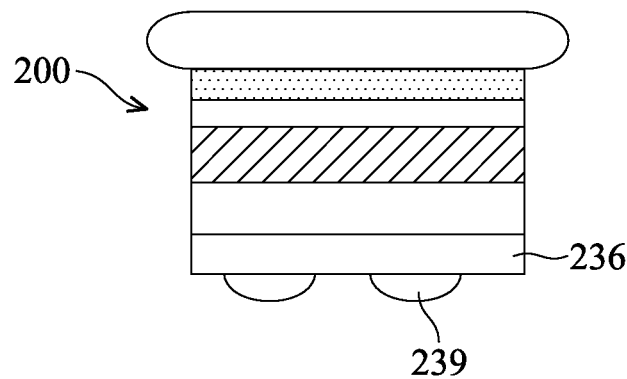

As shown in FIG. 3E, backside structures 236 are formed by backside processing. The formation of backside structures 236 may be the same or substantially the same as the formation of the backside structures 36 described previously herein with respect to FIG. 1H. In some embodiments, one or more portions of the device wafer 212 may be at least partially removed during the backside processing.

Further, as shown in FIG. 3E, conductive contacts 239 are formed on the backside structures 236. The conductive contacts 239 may be any suitable conductive contacts for inputting or outputting electrical signals by the semiconductor device, such as conductive pads, leads, solder balls, solder bumps, or the like.

In some embodiments, the "single bonded" semiconductor device 200 may be completed at the completion of the method illustrated in FIGS. 3A through 3E. It should be noted that although more than one bonding process is performed in the method illustrated in FIGS. 3A through 3E, the formation of the device 200 is considered a "single bonding" method as there is only a single bonding process (e.g., bonding the second carrier wafer 238) that is performed in addition to the standard bonding of the first carrier wafer 218 that is typical for forming any semiconductor device.

In some embodiments, further processing may be performed to complete the semiconductor device 200. For example, in some embodiments, a plurality of semiconductor devices 200 may be formed concurrently during performance of the illustrated manufacturing method, for example, with a plurality of semiconductor dies being formed from the same device wafer 212, and the semiconductor devices 200 may be further processed to separate them from one another, e.g., by a singulation process, and may be formed into semiconductor device packages.

Figure 4A:
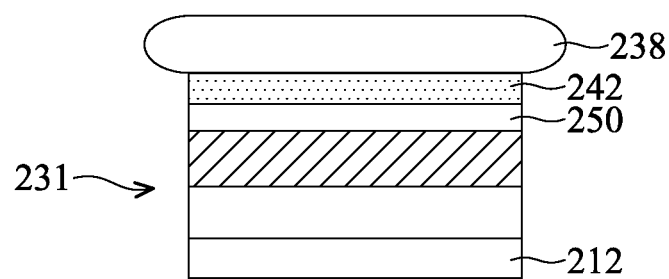
FIGS. 4A through 4C are cross-sectional diagrams schematically illustrating a semiconductor device manufacturing process, in accordance with one or more embodiments of the present disclosure.
Figure 4B:
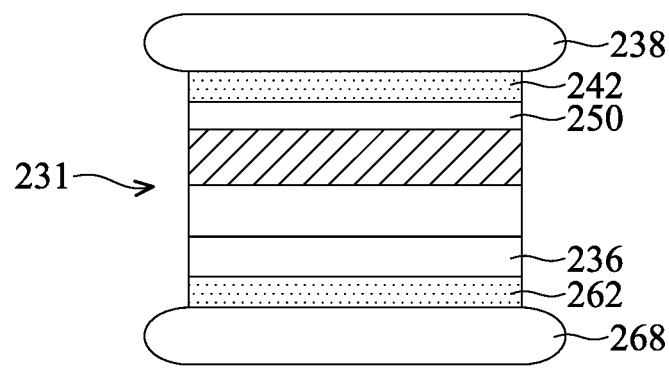
Figure 4C:
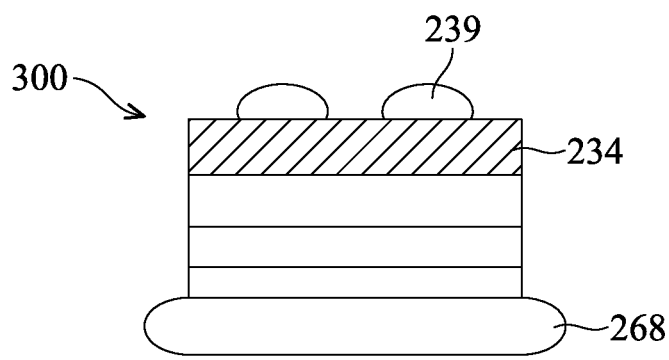

FIGS. 4A through 4C are cross-sectional diagrams schematically illustrating a semiconductor device manufacturing process, in accordance with one or more embodiments of the present disclosure. More particularly, FIGS. 4A through 4C illustrate a "double bonding" method of manufacturing semiconductor devices.

The method illustrated in FIGS. 4A through 4C includes the processes previously shown and described with respect to FIGS. 3A through 3D. As such, FIG. 4A is the same as FIG. 3D previously described herein and will not be described in further detail in the interest of brevity.

As shown in FIG. 4B, backside structures 236 are formed by backside processing. The formation of backside structures 236 may be the same or substantially the same as the formation of the backside structures 36 described previously herein with respect to FIG. 1H. In some embodiments, one or more portions of the device wafer 212 may be at least removed during the backside processing.

A third carrier wafer 268 is bonded to the semiconductor device structure 231, as shown in FIG. 4B. The bonding of the third carrier wafer 268 may be the same or substantially the same as the bonding of the third carrier wafer 68 previously described herein with respect to FIG. 1I. As shown in FIG. 4B, a de-bonding structure 262 may be formed on the third carrier wafer 268. The de-bonding structure 262 may be the same or substantially the same as the de-bonding structure described with respect to FIG. 1I, and may include a de-bonding layer 62 disposed between first and second dielectric layers 60, 64. Additionally, in some embodiments, a dielectric layer 61 (see FIG. 1I) may be formed on the backside of the semiconductor device structure 231, and the de-bonding structure 262 on the third carrier wafer 268 may be bonded to the dielectric layer 61 on the backside of the semiconductor device structure 231.

As shown in FIG. 4C, the second carrier wafer 238 is removed by a de-bonding process, which may be the same or substantially the same as previously described herein. For example, the second carrier wafer 238 may be removed by a laser de-bonding process in which the de-bonding layer of the de-bonding structure 242 is irradiated with laser radiation, thereby loosening or weakening the bond or adhesion to the semiconductor device structure 231 and causing the second carrier wafer 238 and the de-bonding layer 242 to separate and easily be removed.

Further, as shown in FIG. 4C, conductive contacts 239 are formed on the BEOL structures 234. The conductive contacts 239 may be any suitable conductive contacts for inputting or outputting electrical signals by the semiconductor device, such as conductive pads, leads, solder balls, solder bumps, or the like.

In some embodiments, the "double bonded" semiconductor device 300 may be completed at the completion of the method illustrated in FIGS. 4A through 4C. The second bonding process (e.g., bonding the third carrier wafer 268) that is performed in addition to the bonding processes shown of the method described with respect to FIGS. 3A through 3E facilitates removal of the second carrier wafer 238 and formation of the conductive contacts 239 on the BEOL structures 234, while the backside structures 236 are located near or on the third carrier wafer 268. As such, the conductive contacts 239 are formed at the front side of the semiconductor device 300. In contrast, the conductive contacts 239 of the semiconductor device 200 shown in FIG. 3E are formed on the backside structures 236 at the backside of the device 200.

In some embodiments, further processing may be performed to complete the semiconductor device 300, including, for example, singulation of the semiconductor device 300 from among a plurality of semiconductor dies that are formed from the same device wafer 212, or the like.

FIGS. 5A through 5I are cross-sectional diagrams schematically illustrating a semiconductor device manufacturing process, in accordance with one or more embodiments of the present disclosure. More particularly, FIGS. 5A through 5I illustrate a "triple bonding" method of manufacturing semiconductor devices.

Figure 5A:
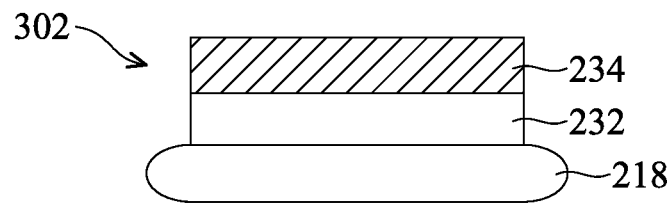
FIGS. 5A through 5I are cross-sectional diagrams schematically illustrating a semiconductor device manufacturing process, in accordance with one or more embodiments of the present disclosure.

As shown in FIG. 5A, a first structure 302 is formed by forming first FEOL structures 232 and first BEOL structures 234 on a first carrier wafer 218. The formation of the first FEOL structures 232 and first BEOL structures 234 may be the same or substantially the same as that of the FEOL structures 32 and BEOL structures 34 described previously herein, for example, with respect to FIG. 1D. In some embodiments, the first FEOL structures 232 are formed on or in a device wafer (not shown) as previously described with respect to FIG. 1D. The FEOL structures 232 may include transistors or transistor structures, such as gates, source/drain regions, and the like, which may be formed on a semiconductor device substrate. The semiconductor device substrate, in some embodiments, may be the first carrier wafer 218 shown in FIG. 5A, portions of which may be included within the FEOL structures 232.

Figure 5B:
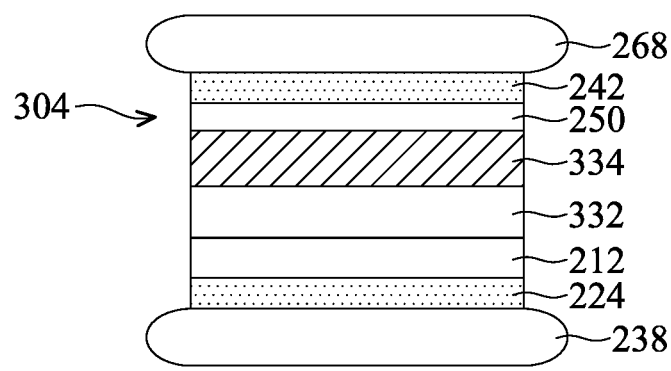

As shown in FIG. 5B, a second structure 304 is formed. The second structure 304 is substantially the same as the structure shown in FIG. 3C and may be formed by the same or substantially same process shown and described with respect to FIGS. 3A through 3C. The second structure 304 includes a second carrier wafer 238, a de-bonding structure 224 on the second carrier wafer 238, and a first device wafer 212 bonded to the de-bonding structure 224. Second FEOL structures 332 and second BEOL structures 334 are formed on the first device wafer 212.

A dielectric structure 250 is formed on the second BEOL structures 334. The dielectric structure 250 may be the same or substantially the same as the dielectric structure 50 described previously herein with respect to FIG. 1E. A third carrier wafer 268 is bonded to the semiconductor device structure. More particularly, a de-bonding structure 242 is formed on the third carrier wafer 268 or is formed on the dielectric structure 250 on the second carrier wafer 238, and the de-bonding structure 242 may be the same or substantially the same as the de-bonding structure described previously herein with respect to FIG. 1E, for example, the de-bonding structure 242 may include a de-bonding layer 42 disposed between first and second dielectric layers 40, 44. The de-bonding structure 242 may be bonded to the dielectric structure 250.

Figure 5C:
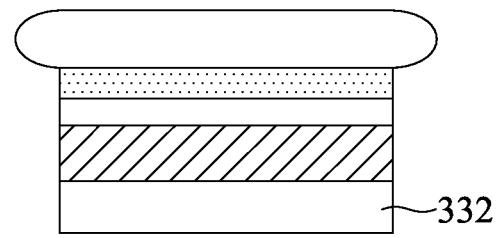

As shown in FIG. 5C, the second carrier wafer 238 is removed by a de-bonding process, which may be the same or substantially the same as previously described herein. For example, the second carrier wafer 238 may be removed by a laser de-bonding process in which the de-bonding layer of the de-bonding structure 224 is irradiated with laser radiation, thereby loosening or weakening the bond or adhesion to the first device wafer 212 and causing the second carrier wafer 238 and the de-bonding structure 224 to separate and easily be removed. In some embodiments, one or more portions of the first device wafer 212 may be at least partially removed during or after the removal of the second carrier wafer 238. Accordingly, as shown in FIG. 5C, at least a portion of the second FEOL structures 332 may be exposed.

Figure 5D:
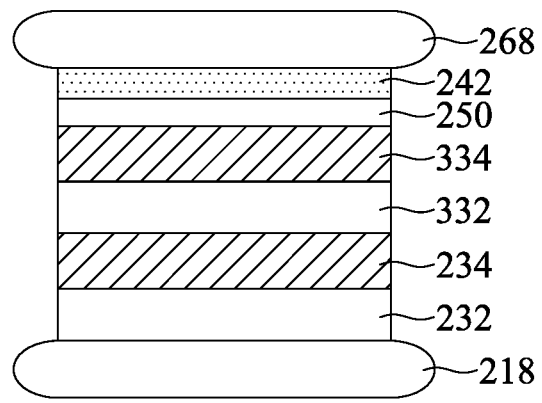

As shown in FIG. 5D, the first structure 302 shown in FIG. 5A is bonded with the structure shown in FIG. 5C, with the first BEOL structures 234 being formed on or otherwise bonded to the second FEOL structures 332. The first BEOL structures 234 may be formed on or bonded to the second FEOL structures 332 by any suitable technique, including, for example, any techniques described herein. In some embodiments, the structure shown in FIG. 5D may be a 3D IC structure. For example, conductive vias, such as through silicon vias (TSVs) may be formed which pass through the silicon substrate of the second FEOL structures 332. For example, the second FEOL structures 332 may include a plurality of transistors at a first side (e.g., a front side or an upper side as shown in FIG. 5D), and TSVs may be formed which extend into or through the second FEOL structures 332, e.g., to connect the transistors at the front side to a backside (e.g., a lower side as shown in FIG. 5D). In some embodiments, a bonding structure is formed on the backside of the second FEOL structures 332 to bond with the first BEOL structures 234.

At the completion of the bonding shown in FIG. 5D, two layers of semiconductor devices (e.g., as may be formed or defined in the first and second FEOL structures 232, 332) are present in the semiconductor device structure, along with two layers of interconnections or BEOL structures (e.g., as may be formed or defined in the first and second BEOL structures 234, 334).

Figure 5E:
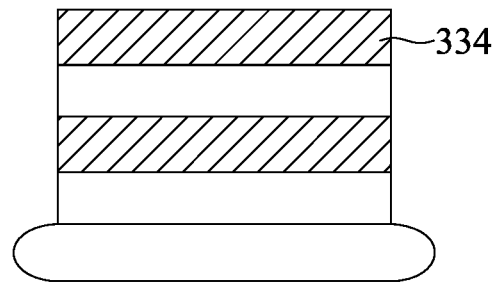

As shown in FIG. 5E, the third carrier wafer 268 is removed by a de-bonding process, which may be the same or substantially the same as previously described herein. In some embodiments, the de-bonding structure 242 and the dielectric structure 250 may be removed concurrent or subsequent to the removal of the third carrier wafer 268. Accordingly, as shown in FIG. 5E, at least a portion of the second BEOL structures 334 may be exposed.

Figure 5F:
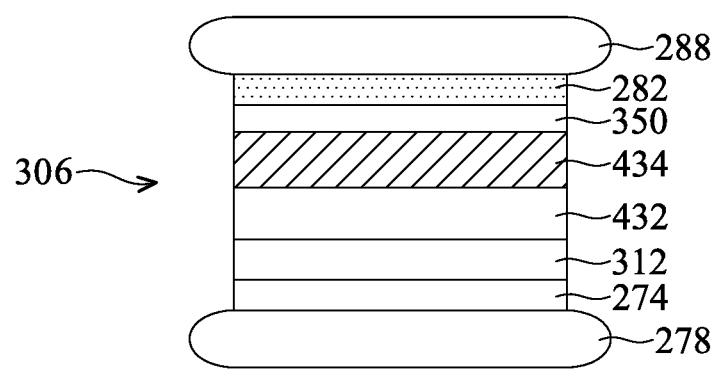

As shown in FIG. 5F, a third structure 306 is formed. The third structure 306 is substantially the same as the second structure 304 shown in FIG. 5B and may be formed by the same or substantially same process shown and described previously herein. The third structure 306 includes a fourth carrier wafer 278, a de-bonding structure 274 on the fourth carrier wafer 278, and a second device wafer 312 bonded to the de-bonding structure 274. Third FEOL structures 432 and third BEOL structures 434 are formed on the second device wafer 312.

A dielectric structure 350 is formed on the third BEOL structures 434. The dielectric structure 350 may be the same or substantially the same as the dielectric structure 50 described previously herein with respect to FIG. 1E. A fifth carrier wafer 288 is bonded to the semiconductor device structure. More particularly, a de-bonding structure 282 is formed on the fifth carrier wafer 288, and the de-bonding structure 282 may be the same or substantially the same as the de-bonding structure described previously herein with respect to FIG. 1E, for example, the de-bonding structure 282 may include a de-bonding layer 42 disposed between first and second dielectric layers 40, 44. The de-bonding structure 282 may be bonded to the dielectric structure 350.

Figure 5G:
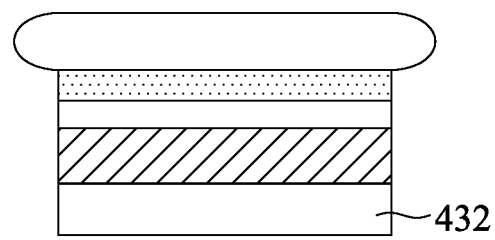

As shown in FIG. 5G, the fourth carrier wafer 278 is removed by a de-bonding process, which may be the same or substantially the same as previously described herein, such as by a laser de-bonding process in which the de-bonding layer of the de-bonding structure 274 is irradiated with laser radiation, causing the fourth carrier wafer 278 and the de-bonding structure 274 to separate and easily be removed. In some embodiments, one or more portions of the second device wafer 312 may be at least partially removed during or after the removal of the fourth carrier wafer 278. Accordingly, as shown in FIG. 5G, at least a portion of the third FEOL structures 432 may be exposed.

Figure 5H:
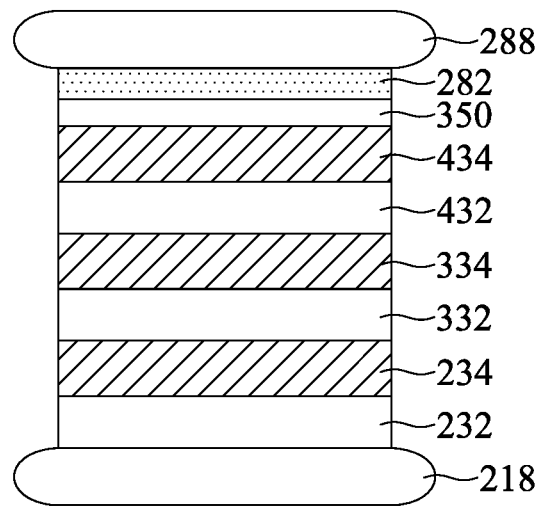

As shown in FIG. 5H, the structure shown in FIG. 5G is bonded with the structure shown in FIG. 5E, thus resulting in a structure having three layers of semiconductor devices (e.g., as may be formed or defined in the first, second, and third FEOL structures 232, 332, 432), and three layers of interconnections or BEOL structures (e.g., as may be formed or defined in the first, second, and third BEOL structures 234, 334, 434).

Figure 5I:
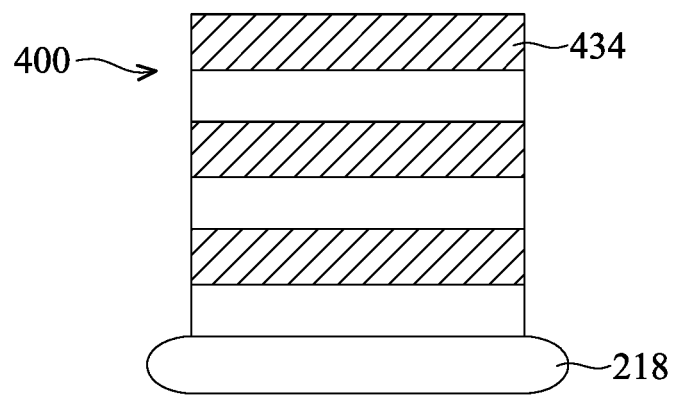

As shown in FIG. 5I, the fifth carrier wafer 288 is removed by a de-bonding process, which may be the same or substantially the same as previously described herein. In some embodiments, the de-bonding structure 282 and the dielectric structure 350 may be removed concurrent or subsequent to the removal of the fifth carrier wafer 288. Accordingly, as shown in FIG. 5I, at least a portion of the third BEOL structures 434 may be exposed.

Although not shown in FIG. 5I, the method may further include forming conductive contacts, for example, on the third BEOL structures 434. The conductive contacts may be formed by any suitable technique, including any techniques described herein.

In some embodiments, the "triple bonded" semiconductor device 400 may be completed at the completion of the method illustrated in FIGS. 5A through 5I. The additional bonding process that are performed in the method described with respect to FIGS. 5A through 5I facilitate formation of multiple semiconductor device layers (e.g., FEOL layers) and multiple interconnection or wiring layers (e.g., BEOL layers) stacked vertically in an alternating arrangement. It will be readily appreciated that semiconductor devices having any number of semiconductor device layers and interconnection or wiring layers may be formed by the methods provided herein in various embodiments. As such, multi-layer (or multi-bonding) semiconductor devices or integrated circuits, such as 3DICs can may be formed in various embodiments provided herein.

Each of the semiconductor device layers (e.g., FEOL layers) may include semiconductor devices having particular or different structures, circuitry, or functionalities. For example, in some embodiments, one FEOL layer may include logic structures or circuitry, while another FEOL layer of the same semiconductor device may include memory circuitry or structures. This facilitates an increase in performance of communication between the memory and logic structures, as they are located near one another in the same semiconductor device and routing or wiring (e.g., via the BEOL layers) may provide a reduced signal path length.

During formation of each of the semiconductor devices 200, 300, 400, the wafers or carrier wafers maintain their original dimensions. For example, a width of the wafers is the same after completion of formation of the semiconductor devices 200, 300, 400 as at the beginning of the processing steps in which the wafers are introduced. That is, the width of the wafers is not reduced due to trimming processes.

Embodiments of the present disclosure provide several advantages. For example, the inclusion of the de-bonding layers facilitates removal of the wafers using a laser de-bonding process, which avoids or replaces trimming of the wafers as part of a process to thin down the wafer. By avoiding the trimming process, significant cost savings are accomplished through embodiments of the present disclosure, as the wafers are not trimmed and thus no portion of the wafers is wasted or lost as part of the semiconductor device manufacturing processes provided herein.

Moreover, the laser de-bonding processes implemented in various embodiments are relatively simple to perform in comparison to example processes in which trimming processes are utilized. Further, the manufacturing processes provided in various embodiments herein reduce manufacturing risks as the risk of breakage or damage is lowered since the wafers are not trimmed. Instead, the wafers maintain their original dimensions as they are not trimmed at all, and problems associated with trimmed edges can be avoided. Moreover, cost savings may be realized in accordance with methods provided herein, since the wafers can be reused as opposed to being wasted due to trimming processes. Additionally, embodiments provided herein facilitate formation of semiconductor devices having multiple semiconductor layers which may be formed in multiple bonding processes. For example, single bonding, double bonding, triple bonding, and any number of bonding processes may be utilized to manufacture semiconductor devices in accordance with some embodiments.

According to one embodiment, a method of manufacturing a semiconductor device structure is provided that includes bonding a device substrate to a first de-bond layer. The first de-bond layer is disposed on a first carrier substrate, and the device substrate has a first side facing the first carrier substrate and a second side opposite from the first side. The device substrate has a first width. A front-end-of-line (FEOL) process and a back-end-of-line (BEOL) process are performed on the device substrate. A second carrier substrate having a second de-bond layer is bonded on the second side of the device substrate. The first carrier substrate is removed by removing the first de-bond layer. A width of the device substrate remains the first width after removing the first carrier substrate.

According to another embodiment, a method is provided that includes forming a first de-bonding structure on a first carrier wafer. A semiconductor device wafer is bonded to the first carrier wafer, and the first de-bonding structure is disposed between the semiconductor device wafer and the first carrier wafer. A plurality of semiconductor devices is in the semiconductor device wafer. An interconnection layer is formed on the semiconductor device wafer, and the interconnection layer includes a plurality of conductive interconnection structures electrically coupled to the plurality of semiconductor devices. A second de-bonding structure is formed on a second carrier wafer, and the second carrier wafer is bonded to the interconnection layer. The second de-bonding structure is disposed between the second carrier wafer and the interconnection layer. The first carrier wafer is removed by removing the first de-bonding structure. The removing the first de-bonding structure includes irradiating the first de-bonding structure with laser irradiation.

According to yet another embodiment, a method is provided that includes bonding a device wafer to a first de-bond layer on a first carrier wafer. The device wafer has a first width. A plurality of transistors is formed at least partially in the device wafer. An interconnection layer is formed on the device wafer, and the interconnection layer includes a plurality of conductive structures electrically coupled to the plurality of transistors. A second carrier wafer having a second de-bond layer is bonded on the device wafer, and the device wafer is disposed between the first carrier wafer and the second carrier wafer. The first carrier wafer is removed by removing the first de-bond layer, and a width of the device wafer remains the first width after removing the first carrier wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of manufacturing a semiconductor device structure, comprising:
   bonding a device substrate to a first de-bond layer, the first de-bond layer disposed on a first carrier substrate, the device substrate having a first side facing the first carrier substrate and a second side opposite from the first side, the device substrate having a first width;
   performing a front-end-of-line (FEOL) process and a back-end-of-line (BEOL) process on the device substrate;
   bonding a second carrier substrate having a second de-bond layer on the second side of the device substrate;
   removing the first carrier substrate by removing the first de-bond layer, wherein a width of the device substrate remains the first width after removing the first carrier substrate;
   bonding a third carrier substrate having a third de-bond layer on the first side of the device substrate; and
   removing the second carrier substrate by removing the second de-bond layer, wherein the width of the device substrate remains the first width after removing the second carrier substrate.

2. The method of claim 1, further comprising:
   reducing a thickness of the device substrate by removing a portion of the device substrate prior to the performing the FEOL process and the BEOL process on the device substrate.

3. The method of claim 1, further comprising:
   forming an oxide layer on the first side of the device substrate prior to the bonding the device substrate to the first de-bond layer.

4. The method according to claim 1, wherein forming the first de-bond layer includes forming the first de-bond layer including at least one of SiCN, SiOCN, SiN, SiO2, HfO2, ZrO2, HfAlOx, HfSiOx, TiN, or an organic material.

5. The method of claim 1, further comprising:
forming one or more conductive structures on the first side of the device substrate, the one or more conductive structures disposed between the first side of the device substrate and the third carrier substrate.

6. The method of claim 1, wherein the removing the first de-bond layer includes irradiating the first de-bond layer with laser irradiation.

7. The method of claim 1, further comprising:
forming the first de-bond layer on the first carrier substrate, the first de-bond layer including a first dielectric layer on the first carrier substrate, a de-bonding material layer on the first dielectric layer, and a second dielectric layer on the de-bonding material layer.

8. A method, comprising:
forming a first de-bonding structure on a first carrier wafer;
bonding a semiconductor device wafer to the first carrier wafer, the first de-bonding structure disposed between the semiconductor device wafer and the first carrier wafer;
forming a plurality of semiconductor devices in the semiconductor device wafer;
forming an interconnection layer on the semiconductor device wafer, the interconnection layer including a plurality of conductive interconnection structures electrically coupled to the plurality of semiconductor devices;
forming a second de-bonding structure on a second carrier wafer;
bonding the second carrier wafer to the interconnection layer, the second de-bonding structure disposed between the second carrier wafer and the interconnection layer; and
removing the first carrier wafer by removing the first de-bonding structure, the removing the first de-bonding structure including irradiating the first de-bonding structure with laser irradiation.

9. The method of claim 8, wherein the semiconductor device wafer has a same width before and after the removing the first carrier wafer.

10. The method of claim 8, wherein the forming the first de-bonding structure includes:
forming a first oxide layer on the first carrier wafer;
forming a first de-bonding material layer on the first oxide layer; and
forming a second oxide layer on the first de-bonding material layer.

11. The method of claim 10, wherein forming the first de-bonding material layer includes forming the first de-bonding material layer including at least one of SiCN, SiOCN, SiN, SiO2, HfO2, ZrO2, HfAlOx, HfSiOx, TiN, or an organic material.

12. The method of claim 8, further comprising:
forming a first oxide layer on the interconnection layer;
forming a silicon nitride layer on the first oxide layer; and
forming a second oxide layer on the silicon nitride layer.

13. The method of claim 8, further comprising:
forming a backside conductive layer on the semiconductor device wafer, the backside conductive layer including a plurality of backside conductive structures, the semiconductor device wafer disposed between the backside conductive layer and the interconnection layer.

14. The method of claim 13, further comprising:
forming a third de-bonding structure on a third carrier wafer;
bonding the third carrier wafer to the backside conductive layer; and
removing the second carrier wafer by removing the second de-bonding structure.

15. The method of claim 14, further comprising:
forming a dielectric layer between the backside conductive layer and the third carrier wafer.

16. The method of claim 8, further comprising:
forming an oxide layer on the semiconductor device wafer prior to the bonding the semiconductor device wafer to the first carrier wafer.

17. A method, comprising:
bonding a device wafer to a first de-bond layer on a first carrier wafer, the device wafer having a first width;
forming a plurality of transistors at least partially in the device wafer;
forming an interconnection layer on the device wafer, the interconnection layer including a plurality of conductive structures electrically coupled to the plurality of transistors;
bonding a second carrier wafer having a second de-bond layer on the device wafer, the device wafer disposed between the first carrier wafer and the second carrier wafer;
removing the first carrier wafer by removing the first de-bond layer, wherein a width of the device wafer remains the first width after removing the first carrier wafer;
forming a backside conductive layer on the device wafer, the backside conductive layer including a plurality of backside conductive structures, the plurality of transistors disposed between the backside conductive layer and the interconnection layer; and
forming an electrically conductive contact on the backside conductive layer and electrically coupled to at least one of the plurality of backside conductive structures.

18. The method of claim 17, further comprising:
bonding a third carrier wafer having a third de-bond layer on the backside conductive layer; and
removing the second carrier wafer by removing the second de-bond layer, wherein the interconnection layer is at least partially exposed after the removing the second carrier wafer.

19. The method according to claim 17, wherein the removing the first de-bond layer includes irradiating the first de-bond layer with laser irradiation.

20. The method according to claim 17, wherein forming the first de-bond layer includes forming the first de-bond layer including at least one of SiCN, SiOCN, SiN, SiO2, HfO2, ZrO2, HfAlOx, HfSiOx, TiN, or an organic material.

* * * * *